United States Patent
Kim et al.

(10) Patent No.: US 7,170,794 B2
(45) Date of Patent: Jan. 30, 2007

(54) PROGRAMMING METHOD OF A NON-VOLATILE MEMORY DEVICE HAVING A CHARGE STORAGE LAYER BETWEEN A GATE ELECTRODE AND A SEMICONDUCTOR SUBSTRATE

(75) Inventors: Ki-Chul Kim, Gyeonggi-do (KR);
Byou-Ree Lim, Gyeonggi-do (KR);
Sang-Su Kim, Gyeonggi-do (KR);
Geum-Jong Bae, Incheon (KR);
Kwang-Wook Koh, Gyeonggi-do (KR)

(73) Assignee: Samsung Electronis Co., Ltd., Suwon-Si (KR)

( * ) Notice: Subject to any disclaimer, the term of this patent is extended or adjusted under 35 U.S.C. 154(b) by 0 days.

(21) Appl. No.: 10/971,201

(22) Filed: Oct. 21, 2004

(65) Prior Publication Data
US 2005/0088879 A1  Apr. 28, 2005

(30) Foreign Application Priority Data
Oct. 22, 2003  (KR) .................. 10-2003-0074001

(51) Int. Cl.
*G11C 11/34* (2006.01)
(52) U.S. Cl. ................................ 365/185.28
(58) Field of Classification Search .......... 365/185.28, 365/185.29, 185.3, 185.15
See application file for complete search history.

(56) References Cited

U.S. PATENT DOCUMENTS

| | | | | |
|---|---|---|---|---|
| 5,751,636 A | * | 5/1998 | Naruke et al. ......... | 365/185.29 |
| 5,768,192 A | * | 6/1998 | Eitan ...................... | 365/185.24 |
| 5,801,993 A | * | 9/1998 | Choi ....................... | 365/185.28 |
| 5,963,476 A | * | 10/1999 | Hung et al. ............. | 365/185.22 |
| 6,181,604 B1 | * | 1/2001 | Lu et al. ................. | 365/185.22 |
| 6,222,779 B1 | * | 4/2001 | Saito et al. ............. | 365/189.09 |
| 6,368,918 B2 | * | 4/2002 | Cunningham et al. ...... | 438/260 |
| 6,614,694 B1 | * | 9/2003 | Yeh et al. ............... | 365/185.29 |
| 6,807,100 B2 | * | 10/2004 | Tanaka .................... | 365/185.28 |
| 6,847,556 B2 | * | 1/2005 | Cho ........................ | 365/185.28 |
| 6,894,931 B2 | * | 5/2005 | Yaegashi et al. ........ | 365/185.22 |
| 6,927,131 B2 | * | 8/2005 | Kim .......................... | 438/261 |

OTHER PUBLICATIONS

Chan et al. "A True Single-Transistor Oxide-Nitride-Oxide EEPROM Device" IEEE Electron Device Letters, vol. 8, No. 3 1987, pp. 93-95.

* cited by examiner

*Primary Examiner*—Amir Zarabian
*Assistant Examiner*—Anthan Tran
(74) *Attorney, Agent, or Firm*—Marger Johnson & McCollom, P.C.

(57) ABSTRACT

A programming method of a non-volatile memory device includes a pre-program of the non-volatile memory device, and a main-program of the pre-programmed non-volatile memory device. The non-volatile memory device may include a tunnel dielectric layer, a charge storage layer, a blocking dielectric layer, and a gate electrode, which are sequentially stacked on a semiconductor substrate. The charge storage layer may be an electrically-floated conductive layer, or a dielectric layer having a trap site. By performing a main-program after performing a pre-program, to increase the threshold voltage of the non-volatile memory device, the program current can be effectively reduced.

24 Claims, 11 Drawing Sheets

PROGRAMMING METHOD OF A NON-VOLATILE MEMORY DEVICE HAVING A CHARGE STORAGE LAYER BETWEEN A GATE ELECTRODE AND A SEMICONDUCTOR SUBSTRATE

CROSS-REFERENCE TO RELATED APPLICATION

This application claims the benefit of Korean Patent Application No. 2003-74001, filed on Oct. 22, 2003, the disclosure of which is hereby incorporated herein by reference in its entirety.

BACKGROUND OF THE INVENTION

1. Field

The disclosure relates to a non-volatile memory device and, more particularly, to a programming method of a non-volatile memory device having a charge storage layer between a gate electrode and a semiconductor substrate.

2. Description of the Related Art

A non-volatile memory device is distinguished from a volatile memory device in that previous data is maintained even though supplied power is cut off.

Generally, the non-volatile memory device has a charge storage layer between a semiconductor substrate and a gate electrode. According to the structure of the charge storage layer, the non-volatile memory devices are roughly classified into floating gate type memory devices and MNOS type memory devices.

The floating gate type non-volatile memory device has a structure that includes a tunnel dielectric layer, a floating gate, an intergate insulating layer, and a control gate, which are stacked on a semiconductor substrate. The floating gate where charges are stored is formed of a conductive layer.

The MNOS type non-volatile memory device has a structure of MNOS (metal nitride oxide semiconductor) or MONOS (metal oxide nitride oxide semiconductor). That is, it has a structure that includes a dielectric layer between a semiconductor substrate and a gate, serving as a charge storage layer. The MNOS type non-volatile memory device stores data by using a trap site inside the dielectric layer, and a trap site exiting in the interface, for example, the interface between the dielectric layer and the semiconductor substrate. Specifically, in the case that the gate is formed of a polysilicon layer, it has a structure of SONOS (silicon oxide nitride oxide silicon). Chan, et al. introduced "SONOS type memory devices" (IEEE Electron Device Letters, Vol. 8, No. 3, p. 93, 1987).

The programming of the non-volatile memory device is performed mostly using hot electrons. The current consumed during the programming ranges from dozens of $\mu A$ to hundreds of $\mu A$. As such, with this large consumption of program current, the function and efficiency of the device are deteriorated. For example, in an embedded device, it is difficult to adjust a predetermined program current specification. $10\ \mu A$ to $15\ \mu A$ of program current per cell is required in order to use a typical merged flash logic, but it is difficult to satisfy such a requirement in the programming method using hot electrons. In a stand-alone device, since the size of a charge pumping circuit needs to be increased in order to supply a program current, chip size is increased, thereby deteriorating its cell efficiency.

SUMMARY OF THE INVENTION

Exemplary embodiments of the invention provide a programming method of a non-volatile memory device having a charge storage layer between a gate electrode and a semiconductor substrate.

In accordance with an exemplary embodiment, the invention provides a programming method of a non-volatile memory device. The programming method includes pre-programming the non-volatile memory device, and main-programming the pre-programmed non-volatile memory device. The non-volatile memory device may include a tunnel dielectric layer, a charge storage layer, a blocking dielectric layer, and a gate electrode, which are sequentially stacked on a semiconductor substrate. The charge storage layer may be an electrically-floated conductive layer, or a dielectric layer having a trap site.

The programming method of the non-volatile memory device according to one embodiment of the invention is employed on the non-volatile memory device having a charge storage layer interposed between a semiconductor substrate and a gate electrode, and source/drain in the semiconductor substrate on both sides of the gate electrode. The programming method includes performing a pre-program on the non-volatile memory device so as to inject electrons into the charge storage layer and increase a threshold voltage, and performing a main-program on the pre-programmed non-volatile memory device.

In accordance with another exemplary embodiment, the invention provides a programming method of a non-volatile memory device, and the programming method is employed on the non-volatile memory device having a tunnel dielectric layer, a charge storage layer, a blocking dielectric layer, and a gate electrode, which are stacked on a semiconductor substrate. Also, a source and a drain in the semiconductor substrate are on both sides of the gate electrode, respectively. The programming method includes performing a pre-program on the non-volatile memory device so as to inject electrons into the charge storage layer and increase a threshold voltage, and performing a main-program on the pre-programmed non-volatile memory device.

The pre-program is preferably performed under the conditions of a gate voltage and a drain voltage being lower than those for the main-program.

The pre-program may be performed by utilizing various methods such as inducing the generation of hot electrons, inducing the F-N tunneling, or the like.

Firstly, the threshold voltage of the non-volatile memory device may be increased by inducing CHEI (Channel Hot Electron Injection) in the low voltage ranges in which relatively low program current is consumed. In order to induce CHEI, a high voltage is applied on the gate electrode to generate an electric potential difference between the source and the drain. As a result, hot electrons are generated in the channel area near the drain (or source). The hot electrons exceed the energy barrier of the semiconductor substrate and the tunnel dielectric layer, and are injected into the floating gate or the trap dielectric layer serving as a charge storage layer. With the injection of electrons into the charge storage layer, the threshold voltage is increased.

Each voltage applied on the gate and the drain during the pre-program utilizing the CHEI may be ramped up. That is, a fixed voltage is applied on the gate electrode, and the voltage applied on the drain may be ramped up from an initial given value. The initial given value is lower than the drain voltage during the main-program. Furthermore, the maximum voltage applied on the drain is preferably lower than the drain voltage during the main-program. In the case of ramping up the gate voltage during the pre-program, the drain voltage is ramped up in accordance with the gate voltage. That is, it is preferable to simultaneously increase the gate voltage and the drain voltage. In the case of ramping up each voltage of the gate and the drain, the voltage applied on the source is preferably made constant, or ramped down.

Secondly, the threshold voltage of the non-volatile memory device may be increased in the method of CHISEL (CHannel Initiated Secondary ELectron) for inducing CHEI in the state that a negative voltage is applied on the substrate. Like CHEI, CHISEL also utilizes a lateral electric field generated by the electric potential difference between the source and the drain. The lateral electric field is an electric field in parallel with the electron flow in the channel direction. Firstly, heated electrons (e1) injected from the source to the drain by the lateral electric field collide with the ions inside the drain, so as to generate low energy electron-hole pairs (e2, h2). In the meantime, when a negative voltage is applied on the semiconductor substrate, a vertical electric field is generated being not in parallel with the electron flow in the channel direction. The vertical electric field is generated between the substrate and the drain, and on the interface between the substrate and the gate dielectric layer on the drain boundary. The electrons (e2) among the electron-hole pairs (e2, h2) generated from the firstly heated electrons (e1) remain in the drain, and the holes (h2) are heated by the electric field between the substrate and the drain, and injected into the substrate. The holes (h2) injected into the substrate collide with the ions inside the substrate, so as to generate electron-hole pairs (e3, h3). The electrons (e3) among the electron-hole pairs (e3, h3) generated from the substrate are injected into the drain, or reach the interface between the substrate and the gate dielectric layer. During the process, some of the electrons (e3) are provided with enough energy to exceed the energy barrier between the substrate and the gate dielectric layer, and are injected into the charge storage layer. As such, with the induction of CHISEL, secondary heated electrons (e2, e3) are generated from the firstly heated electrons (e1) by impact ionization feedback, so that more electrons may be injected into the charge storage layer.

Thirdly, the threshold voltage of the non-volatile memory device may be increased by inducing F-N (Fowler-Nordheim) tunneling requiring little consumption of program current. If a positive voltage is applied on the gate electrode, F-N tunneling current is generated all over the tunnel dielectric layer (gate dielectric layer) so that electrons near the substrate are moved toward the charge storage layer. At this time, a negative voltage may be applied on the drain, the source, or the substrate. Unlike CHEI or CHISEL which require the energy supplied to the electrons be high enough to exceed the energy gap between the substrate and the gate dielectric layer, in the case of performing the pre-program utilizing F-N tunneling, there is little generated current consumption due to the additional performance of the pre-program.

The main-program is performed after the pre-program is performed by at least one method among the various methods described above. The main-program is performed with the induction of CHEI or CHISEL.

BRIEF DESCRIPTION OF THE DRAWINGS

The above and other features and advantages of the invention will become more apparent to those of ordinary skill in the art by describing in detail preferred embodiments thereof with reference to the attached drawings in which.

DETAILED DESCRIPTION OF THE INVENTION

The invention will now be described more fully hereinafter with reference to the accompanying drawings, in which preferred embodiments of the invention are shown. This invention may, however, be embodied in different forms and should not be construed as limited to the embodiments set forth herein. Rather, these embodiments are provided so that this disclosure will be thorough and complete, and will fully convey the scope of the invention to those skilled in the art. In the drawings, the thickness of layers and regions are exaggerated for clarity. Like numbers refer to like elements throughout the specification.

FIGS. 1A, 1B, 2A, and 2B are sectional views to illustrate various structures of a non-volatile memory device employing a programming method according to the invention.

Figure 1A:
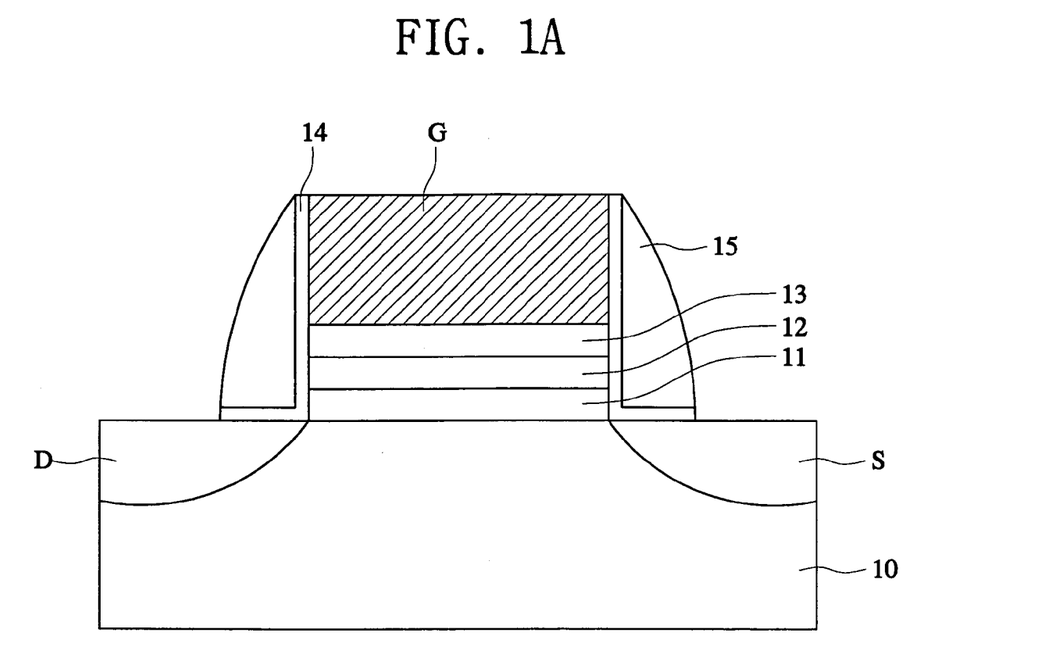
FIGS. 1A and 1B are sectional views to illustrate a structure of an SONOS non-volatile memory device.

Referring to FIG. 1A, the non-volatile memory device may include a tunnel dielectric layer 11, a trap dielectric layer 12, a blocking dielectric layer 13, and a gate electrode G, which are stacked on a semiconductor substrate 10, and source/drain S/D formed in the semiconductor substrate 10 on both sides of the gate electrode G. The non-volatile memory device may further include spacers 14, 15 formed on both side walls of the gate electrode G.

The trap dielectric layer 12 functions as a charge storage layer. The trap dielectric layer 12 has a discrete charge trap site.

The blocking dielectric layer 13 prevents the electrons injected into the trap dielectric layer 12 from coming into the gate electrode G, and prevents holes from coming from the gate electrode G to the trap dielectric layer 12. The tunnel dielectric layer 11 and the blocking dielectric layer 13 may be formed of oxide layers, and the trap dielectric layer 12 may be formed of a silicon nitride layer. Further, the gate electrode G may be formed of silicon. That is, the invention may be employed on a programming method of a non-volatile memory device having an SONOS gate structure. Alternatively, the tunnel dielectric layer 11 and the blocking dielectric layer 13 may be formed of oxide layers, and the trap dielectric layer 12 may be formed of a high-k dielectric material, such as $HfO_2$, $ZrO_2$, $La_2O_3$, or $CeO_2$.

With the programming of the non-volatile memory device having a stack gate structure as shown in FIG. 1A, if electrons are injected into the trap dielectric layer 12, a threshold voltage is increased. Thus, if a voltage applied on the gate electrode G is lower than the increased threshold voltage, a current does not flow through the programmed device. By using the property, stored data can be read.

The non-volatile memory device is erased utilizing a F-N tunneling. That is, a high voltage is applied on the source S, and 0 V is applied on the gate electrode G and the substrate 10, so as to float the drain D. Under these conditions, an electric field is generated between the source S and the trap dielectric layer 12, thereby inducing F-N tunneling. However, since the trap dielectric layer 12 is a non-conductive layer, injected electrons cannot freely move inside the trap dielectric layer 12. Thus, the electrons existing only near the source S can be erased by the F-N tunneling.

Figure 1B:
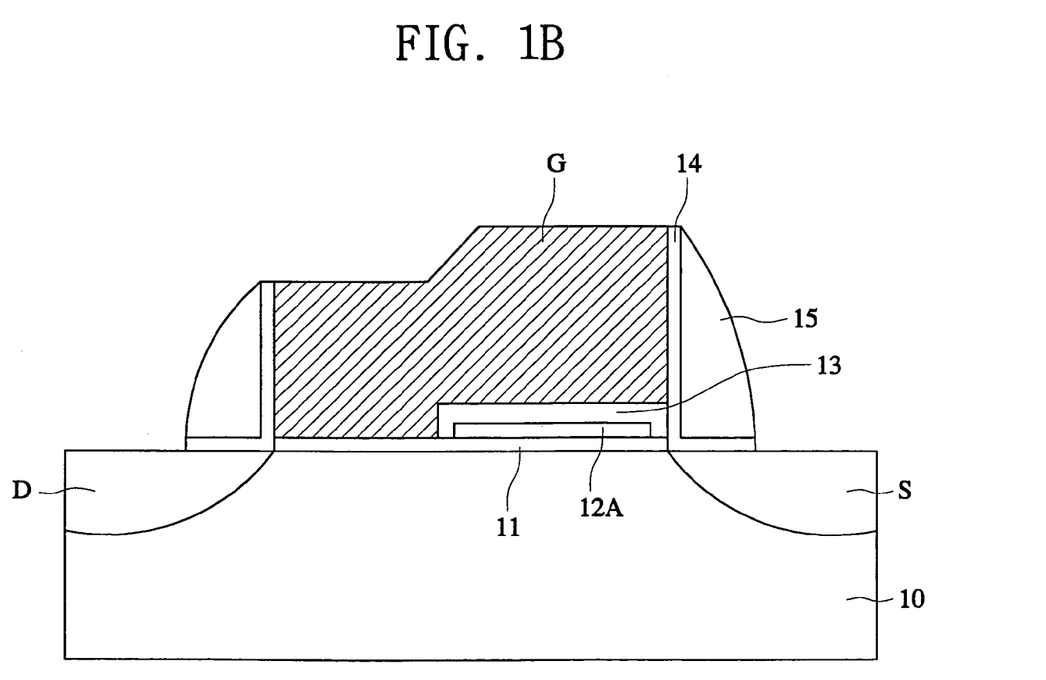

Referring to FIG. 1B, the non-volatile memory device employing the invention may have a structure with the width of a trap dielectric layer 12A, which electrons are trapped in, is not greater than ½ the width of the gate electrode G, and the trap dielectric layer 12A is located closer to the source S (or drain D). The non-volatile memory device having the structure as above may provide an effect of removing hot electrons more efficiently during erasing by F-N tunneling since the trap dielectric layer 12A is formed locally as above. In the structure of the non-volatile memory device as shown in FIG. 1B, the tunnel dielectric layer 11, the trap dielectric layer 12A, and the blocking dielectric layer 13 may be formed of an oxide layer, a nitride layer, and an oxide layer, respectively, and the gate electrode G may be formed of silicon. That is, the invention may be employed on a non-volatile memory device having a local SONOS structure.

Figure 2A:
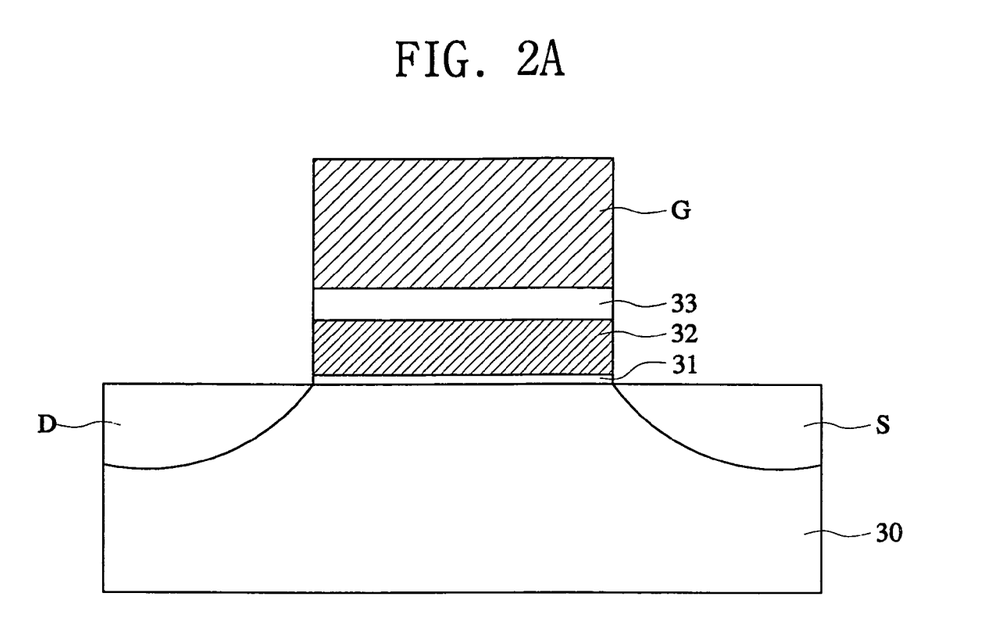
FIGS. 2A and 2B are sectional views to illustrate a structure of a non-volatile memory device having a floating gate.

Referring to FIG. 2A, the non-volatile memory device may include a tunnel dielectric layer 31, a floating gate 32, an intergate insulating layer 33, and a gate electrode G, functioning as a control gate, which are stacked on a semiconductor substrate 30, and source/drain S/D formed in the semiconductor substrate 30 on both sides of the gate electrode G.

The non-volatile memory device having such a structure as shown in FIG. 2A may cause an over-erase phenomenon due to the following reasons. With the non-volatile memory device having unit cells, and the gate electrode G of a programmed selected cell having an increased threshold voltage, if a lower reading voltage than the increased threshold voltage is applied on the gate electrode G, the selected cell is not turned on, and current does not flow through the bit lines. However, if the channel of a non-selected memory cell having the bit lines in common with the selected cell is already formed by the holes injected into the floating gate during erasing, current flow through the bit lines. Thus, current flowing through the selected memory cell leads to a misreading as if the selected memory cell is erased, thereby resulting in over-erase phenomenon.

Figure 2B:
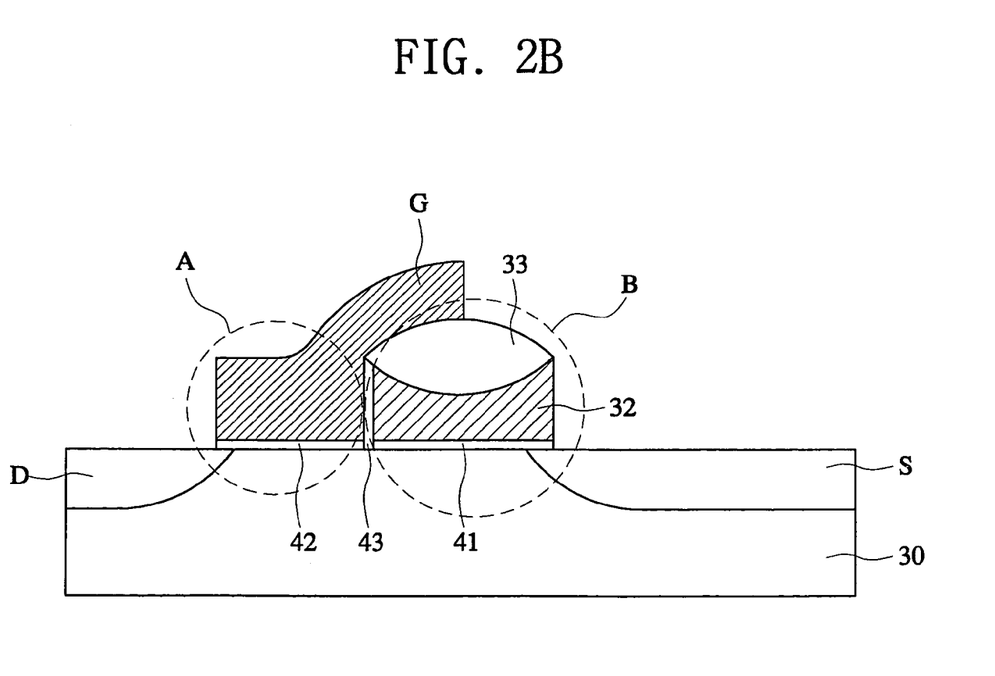

The above problems can be solved by the structure of the non-volatile memory device having a split gate structure as shown in FIG. 2B.

The non-volatile memory device of the split gate structure as shown in FIG. 2B is divided into a switching area A and a charge storage area B. The gate electrode G as a control gate overlaps the semiconductor substrate 30 in the switching area A with a gate insulating layer 42 therebetween, so as to form an access transistor. Thus, a channel area between the floating gate 32 and the drain D is directly controlled by the gate electrode G. Further, a part of the gate electrode G overlaps the floating gate 32 in the charge storage area B. The floating gate 32 is insulated from the semiconductor substrate 30 by a gate insulating layer 41. A tunnel dielectric layer 43 is formed between the floating gate 32 and the gate electrode G. The non-volatile memory device of the split gate structure as shown in FIG. 2B is not turned on if a channel is not formed in the switching area A. That is, even though holes are excessively injected into the floating gate 32 during erasing, a channel is locally formed on the semiconductor substrate 30 under the floating gate 32 only. Therefore, the over-erase phenomenon can be effectively avoided.

Figure 3:
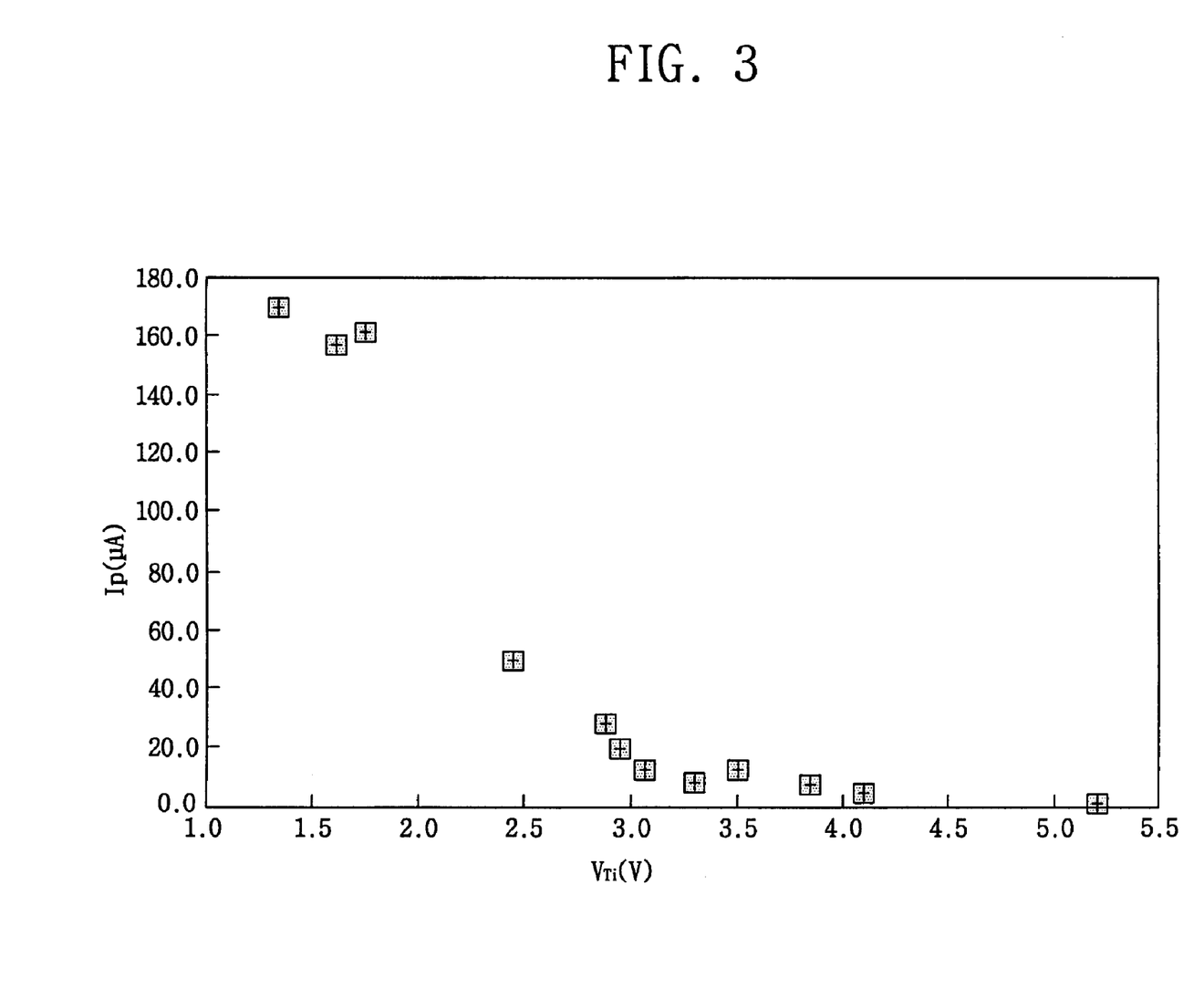
FIG. 3 is a graph depicting the change in program current relative to the change in initial threshold voltage.

The program current of the non-volatile memory device having a trap dielectric layer or a floating gate as a charge storage layer between the semiconductor substrate and the gate electrode is inversely proportional to the threshold voltage. FIG. 3 is a graph depicting the change in program current Ip of the non-volatile memory device relative to the change in initial threshold voltage VTi. As shown in FIG. 3, with the initial threshold voltage increased, the program current is reduced. Therefore the consumption of the program current is reduced when the initial threshold voltage is increased by performing a pre-program before performing a main-program according to the invention. The result in FIG. 3 shows that 10 μA of program current is consumed when the initial threshold voltage of the non-volatile memory device is 3.3 V to 3.7 V.

Figure 4:
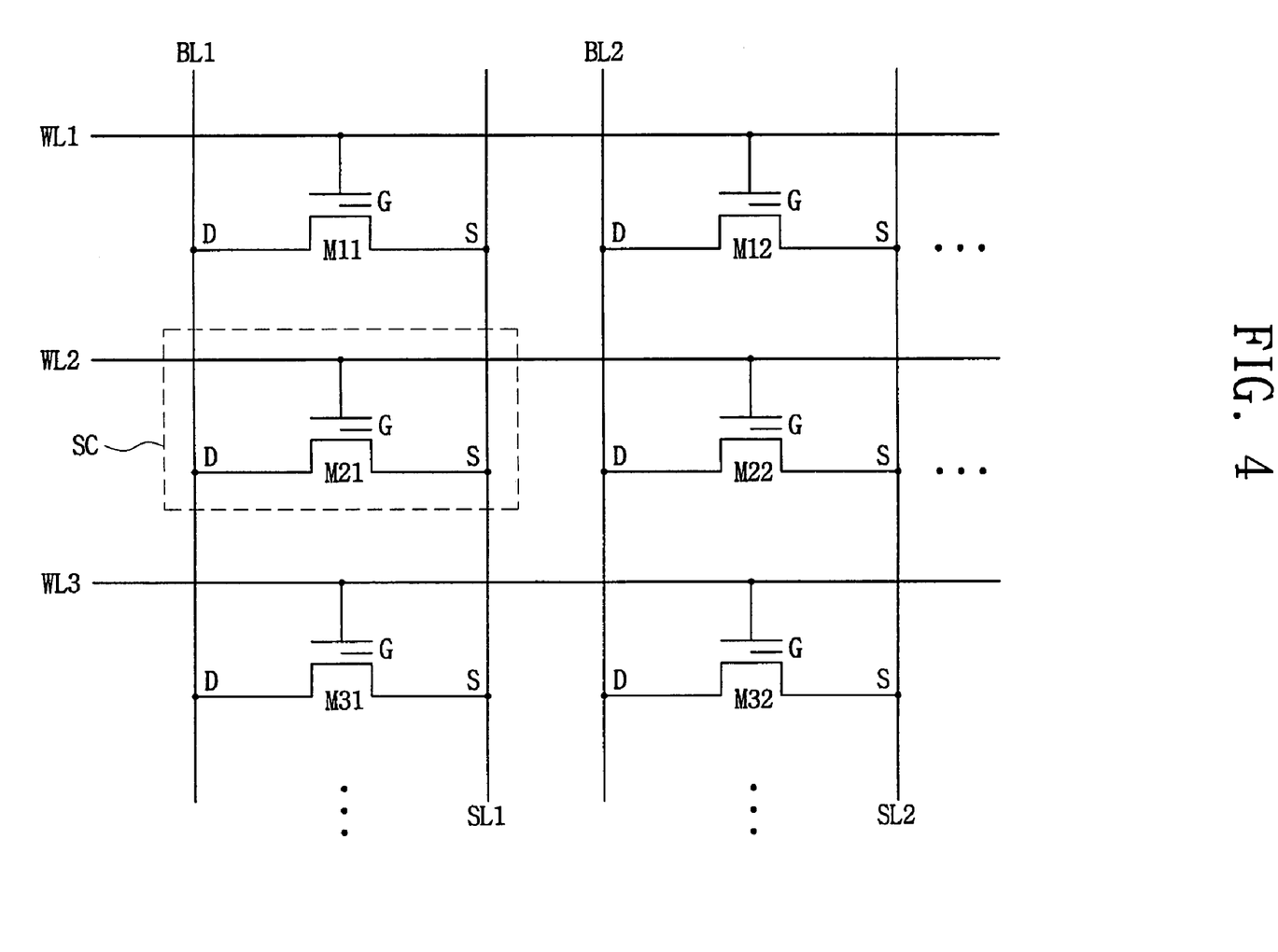
FIG. 4 illustrates a non-volatile memory cell array on which a programming method is employed according to one embodiment of the invention.

Hereinafter, a programming method of the selected cell SC from a memory cell array 100 as shown in FIG. 4 is illustrated.

The non-volatile memory cell array 100 is configured as a NOR type, and a number of memory devices M11, . . . , M32 are aligned in a matrix. Each of the memory devices M11, . . . , M32 may have various structures as shown in FIGS. 1A, 1B, 2A, and 2B. FIG. 4 shows the non-volatile memory devices M11, . . . , M32 of FIG. 4 employing a local SONOS structure shown in FIG. 1B.

The devices placed in a same row have a same word line WL1, WL2, WL3 in common. For example, each gate G of the non-volatile memory devices M11, M12 placed in the same row is connected to the same word line WL1.

The devices placed in a same column have a same bit line BL1, BL2, and a same source line SL1, SL2 in common. For example, each source S of the non-volatile memory devices M11, M21, M31 is connected to the same source line SL1, and each drain D is connected to the same bit line BL1.

The programming method of the non-volatile memory device according to the invention may be employed in a memory cell array having a structure with a common source line, which commonly belongs to neighboring cells in the direction of the word lines WL1, WL2, WL3.

The programming method according to an embodiment of the invention induces the generation of CHEI, performing a pre-program to increase a threshold voltage, and then, performing a main-program.

Referring to FIG. 4 again, a pre-program voltage is applied on a selected cell SC through a word line WL2, i.e., a gate electrode G of a non-volatile memory device M21. A voltage is applied on a source line SL1 and a bit line BL1 to generate a potential difference between the source S and the drain D of the non-volatile memory device M21. According to this embodiment, a pre-program is performed by applying 4.5 V, 4.0 V and 0.8 V on the gate G, the drain D and the source S, respectively, of the non-volatile memory device M21 for 50 µs. On a semiconductor substrate (or well), 0 V may be applied. At this time, 0 V may be applied on the non-selected word lines WL1, WL3, the source line SL2, and the bit line BL2. By inducing CHEI under these voltage conditions, a pre-program is performed, and as a result, the threshold voltage of the non-volatile memory device M21 can be increased up to 3.1 V to 4.0 V.

Figure 5:
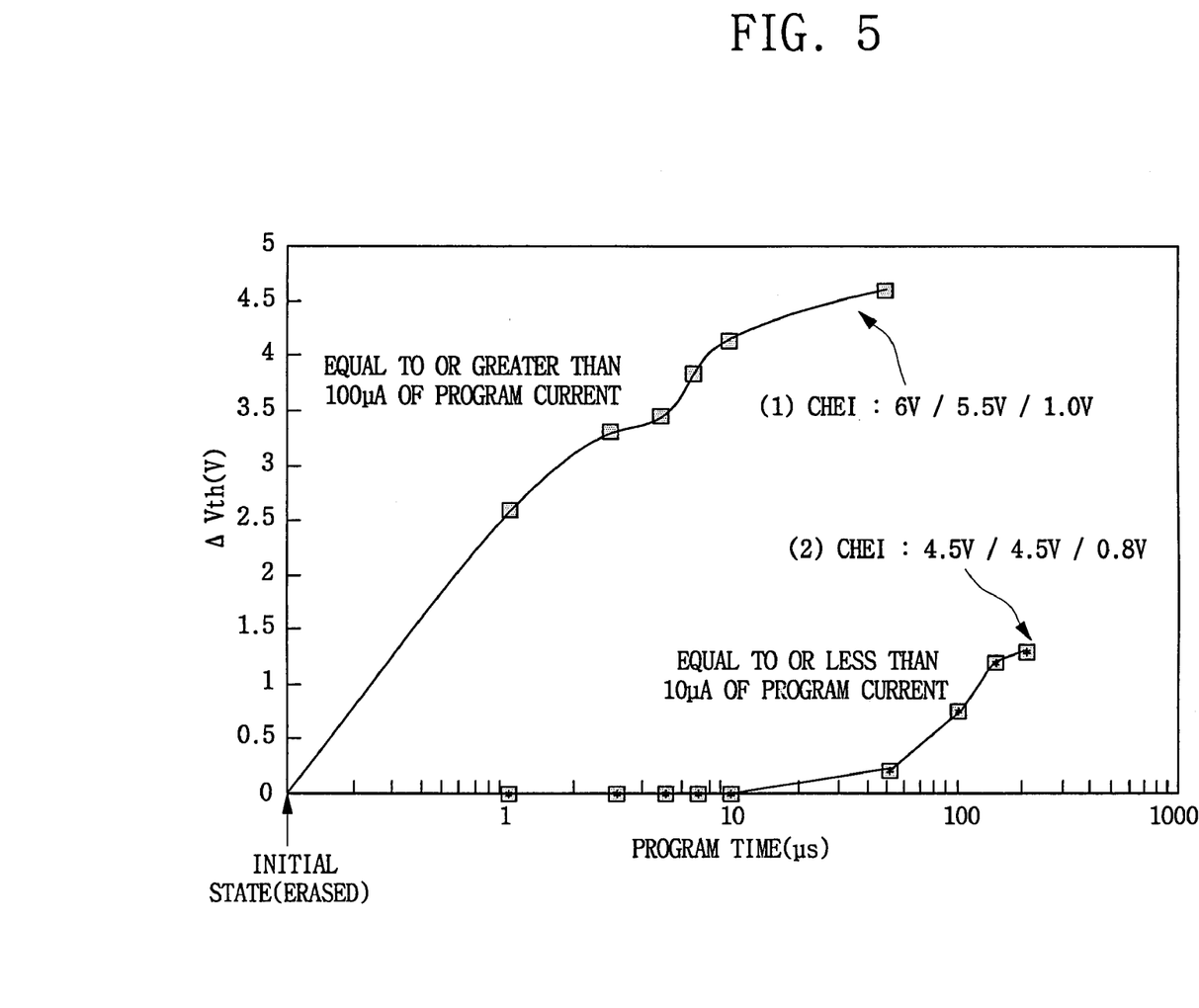
FIG. 5 is a graph depicting the relationship between the increase change in threshold voltage and program time in accordance with CHEI inducing conditions.

FIG. 5 is a graph depicting the change in ΔVth of the threshold voltage Vth relative to program time in accordance with CHEI induction conditions. FIG. 5 shows the comparison of the comparative conditions (1) for inducing relatively high CHEI, and the invention (2) for inducing relatively low CHEI. The comparative conditions (1), 6 V, 5.5 V and 1.0 V are applied on the gate, the drain, and the source respectively. The pre-program conditions according to the embodiment of the invention (2), 4.5 V, 4.5 V and 0.8 V are applied on the gate G, the drain D, and the source S of the non-volatile memory device M21, respectively. As shown in the result of FIG. 5, the threshold voltage of the non-volatile memory device is increased as the CHEI program time is increased. While 100 µA of program current is consumed in the comparative conditions (1) for inducing relatively high CHEI, 10 µA of program current is consumed in the invention (2) for inducing relatively low CHEI.

As described above, a threshold voltage of the non-volatile memory device M21 is increased by performing a pre-program before performing a main-program.

The main-program is performed by applying a program voltage on the gate electrode G of the non-volatile memory device M21 through the word line WL2, and applying a voltage on the bit line BL1 and the source line SL1, so as to generate a potential difference between the source S and the drain D of the non-volatile memory device M21. According to the embodiment, for the main-program, 6.0 V, 5.5 V and 1 V are applied on the gate electrode G, the drain D, and the source S of the non-volatile memory device M21, respectively, and 0 V may be applied on the semiconductor substrate 10. 0 V may be applied on the word lines WL1, WL3, the source line SL2, and the bit line BL2, which are not connected to the selected cell SC.

Figure 6:
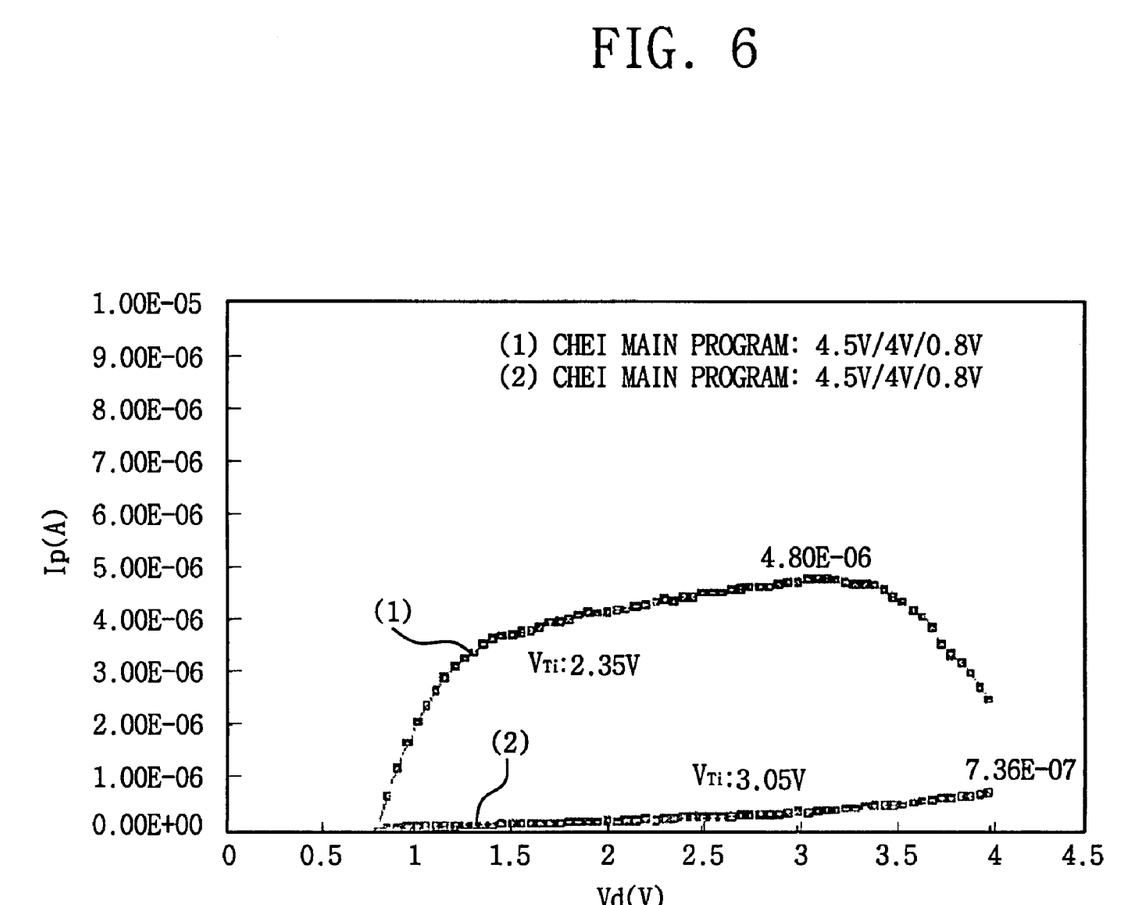
FIG. 6 is a graph depicting the change in program current depending on whether or not to perform a pre-program.

FIG. 6 is a graph depicting the change in program current (IP) with the comparative conditions (1) performing a main-program without a pre-program, and according to the invention (2). The drawing shows results of performing programs in accordance with the comparative conditions (1) and the invention (2), in which 4.5 V, 4.0 V and 0.8 V are applied on the gate, the drain, and the source respectively. The program current is obtained by increasing a drain voltage Vd from 0.8 V to 4.0 V. The program current of the invention (2) is a current amount consumed when the main-program is performed after the threshold voltage is increased by the pre-program utilizing CHEI.

In the case of the comparative conditions (1) performing only a main-program without a pre-program, since an initial threshold voltage is relatively low, 2.35 V, the maximum current consumption is 4.80 µA. On the contrary, in the case of the invention (2) performing a main-program after performing a pre-program, since an initial threshold voltage is relatively high, 3.05 V, the maximum current consumption is 0.736 µA. As such, according to the invention, by performing a main-program after performing a pre-program, to increase the threshold voltage of the non-volatile memory device, the program current can be effectively reduced.

In the case of performing a pre-program utilizing CHEI according to the embodiment of the invention, the current consumed due to the additional performance of the pre-program should not be high. To do this, each voltage applied on the gate and the drain is preferably lower in the pre-program than in the main-program.

Figure 7:
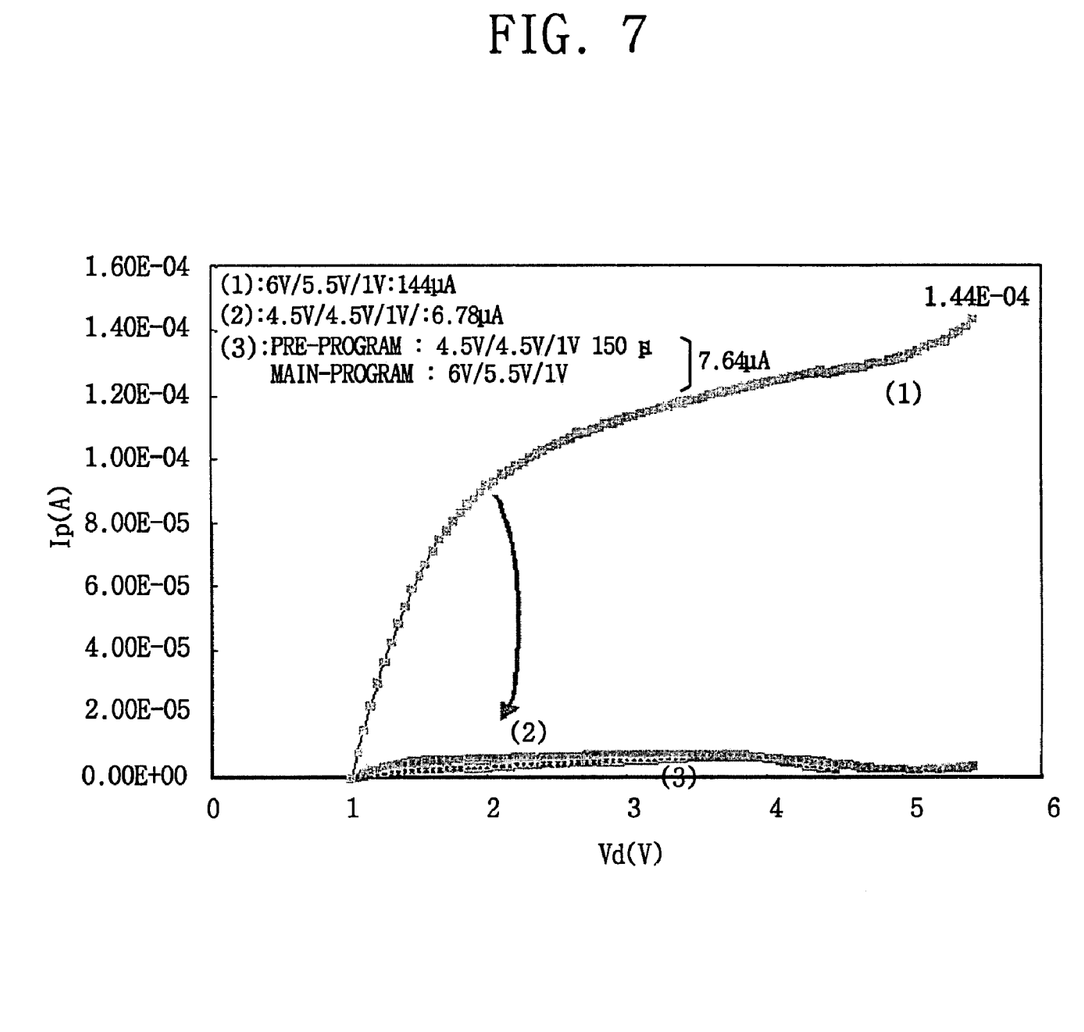
FIG. 7 is a graph depicting the change in program current relative to pre-program voltage.

FIG. 7 is a graph depicting the change in program current in accordance with pre-program voltage. Referring to FIG. 7, as a result of performing the pre-program by applying 6.0 V, 5.5 V and 1 V on the gate, the drain, and the source, respectively, for 1 µs to 5 µs, the consumed maximum program current (1) is 144 µA. On the contrary, as a result of performing the pre-program by applying 4.5 V, 4.5 V and 1 V on the gate, the drain, and the source, respectively, for 1 µs to 5 µs, the consumed program current (2) is 6.78 µA, which is reduced down to 1/20 of the program current (1). Therefore, in order to reduce the consumption amount of the program current, the pre-program is preferably performed under the conditions of the gate voltage and the drain voltage being lower than those of the main-program.

FIG. 7 also shows a program current (3) consumed during the main-program performed after the pre-program according to one embodiment of the invention. The pre-program is performed for 150 µs with the conditions for obtaining the program current (2). And the main-program is performed for 1 µs to 5 µs with the conditions for obtaining the program current (1). The program current (3) consumed as the result of the main-program is 7.64 µA. That is, while the consumed program current (1) in the case of performing a main-program only according to prior art is 144 µA, the consumed program current (3) in the case of performing the pre-program and the main-program according to the invention is 7.64 µA, which is reduced down to 1/19 of the program current (1).

The programming method according to another embodiment of the invention is characterized in inducing the generation of CHISEL, performing a pre-program to increase a threshold voltage, and then, performing a main-program.

In order to induce the generation of CHISEL, a negative voltage is applied on a substrate so as to generate a vertical electric field. More charges can be injected into a charge storage layer with the generation of CHISEL than the case of CHEI. Thus, the time for pre-program can be shorter than that of the previous embodiment utilizing CHEI.

The programming method according to another embodiment of the invention is characterized in inducing F-N tunneling, performing a pre-program (hereinafter, referred to as "F-N pre-program") to increase a threshold voltage, and then, performing a main-program.

Referring to FIG. 4, a high voltage is applied on the selected cell SC, i.e., the gate electrode G of the non-volatile memory device M21, and a negative voltage is applied on the drain D. According to the embodiment, 8.0 V and −4.5 V may be applied on the gate electrode G and the drain D of the non-volatile memory device M21, respectively, for 50 µs. The source S and the semiconductor substrate may be floated, or have 0 V applied thereon. 0 V may be applied on word lines WL1, WL3, the source line SL2, and the bit line BL2, which are not connected to the selected cell SC.

Figure 8:
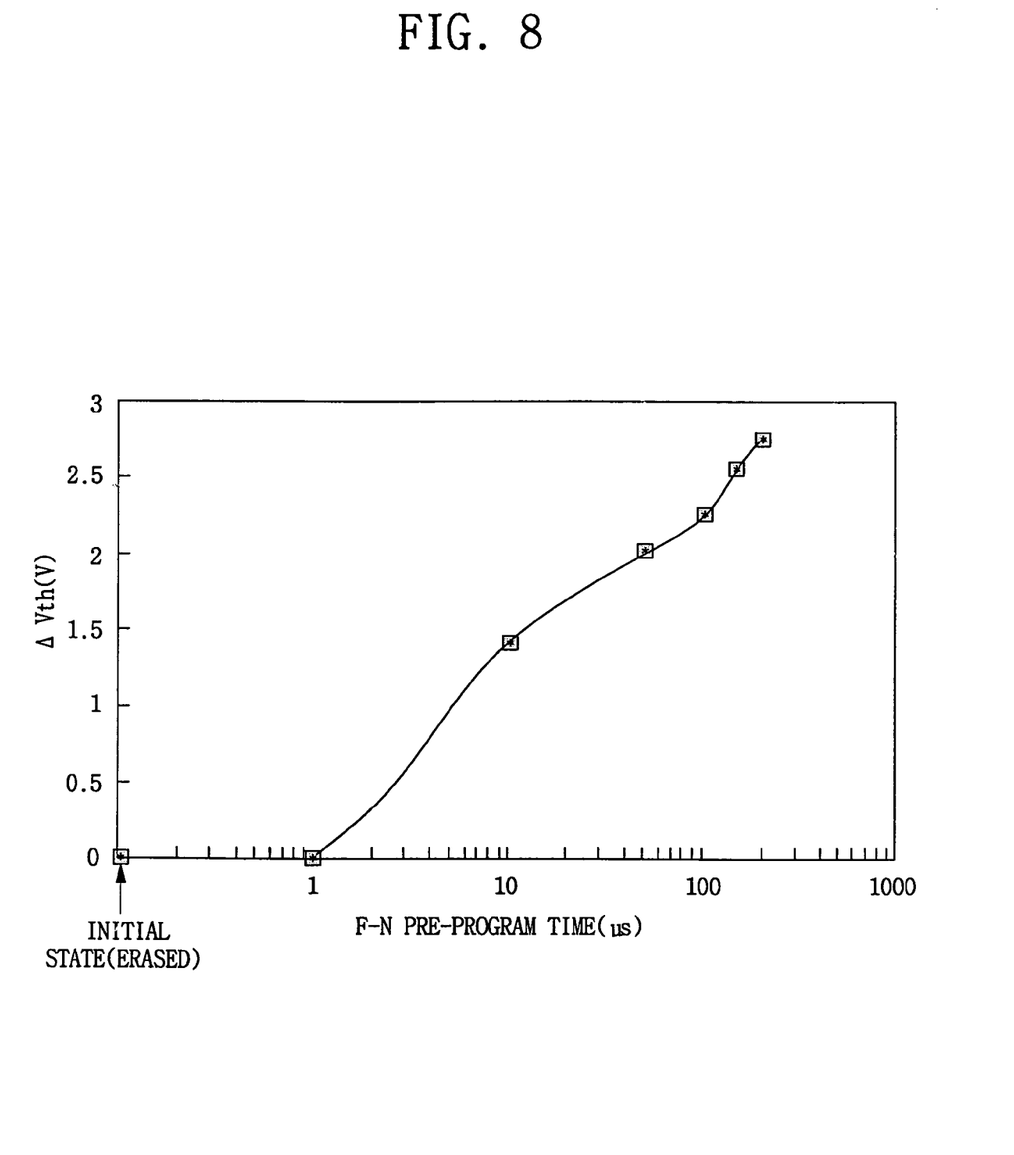
FIG. 8 is a graph depicting the increase change in threshold voltage relative to F-N pre-program time.

FIG. 8 is a graph depicting the change in increase amount of the threshold voltage in accordance with F-N pre-program time under the above conditions. FIG. 8 shows that the threshold voltage increases in proportion to the F-N pre-program time.

The pre-program of the non-volatile memory device according to this embodiment of the invention utilizes injection of electrons inside the semiconductor substrate tunnel into the charge storage layer. If a pre-program is performed using hot electrons like CHEI or CHISEL of the previous embodiments of the invention, then a pre-program current is consumed as much as required to exceed the potential barrier between the substrate and the tunnel dielectric layer. On the contrary, in this embodiment of the invention, an additional current consumption due to the pre-programming is very small since the pre-program is performed by using F-N tunneling passing through the potential barrier.

Figure 9:
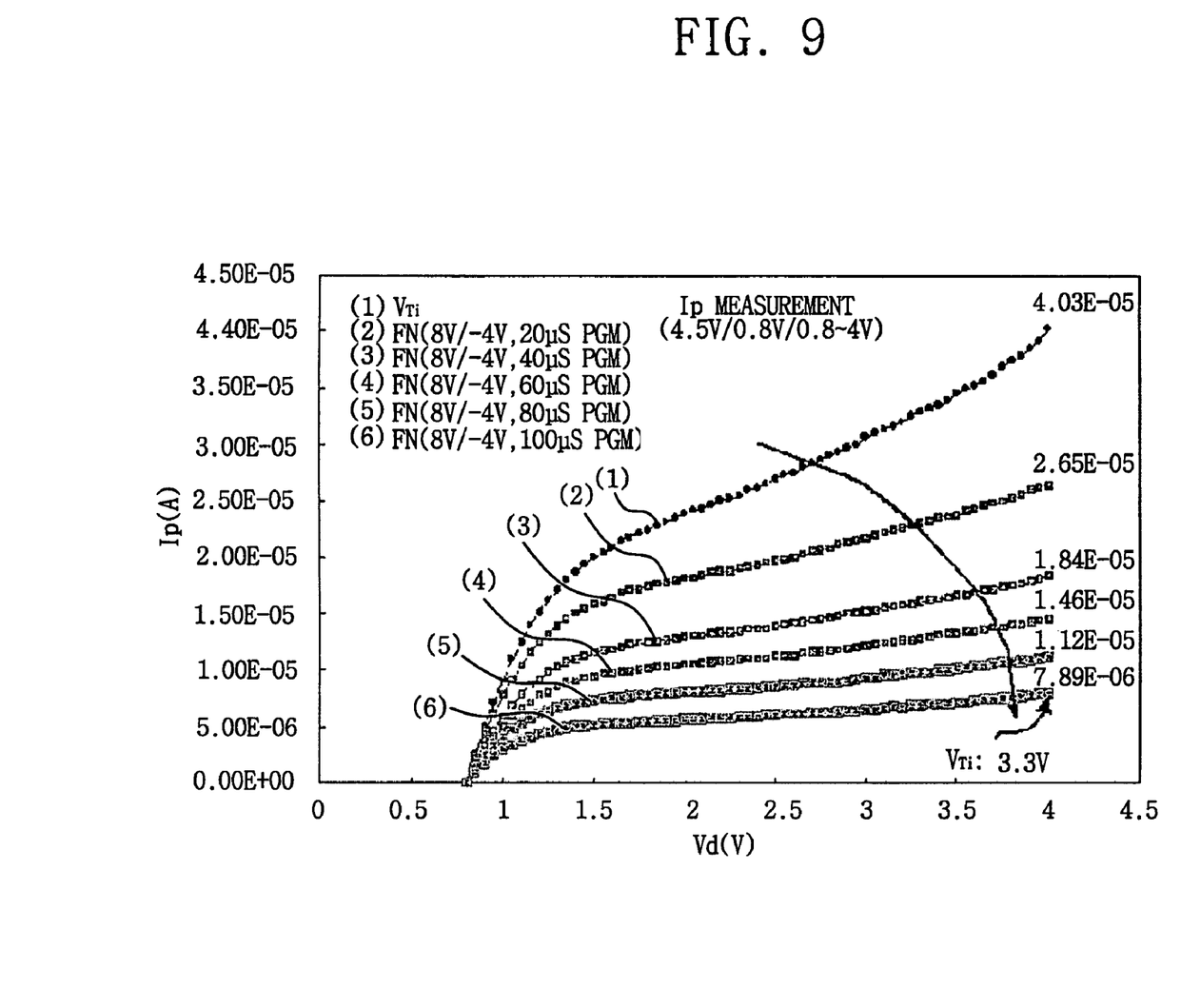
FIG. 9 is a graph depicting the decrease in program current in accordance with F-N pre-program.

FIG. 9 is a graph depicting the decrease in program current in accordance with the performance of F-N pre-program. FIG. 9 shows various program current values with variations of the F-N pre-program time under the same gate and drain voltage conditions. The pre-program is performed by applying 8 V and −4 V on the gate and the drain, respectively. The consumed program current is 40.3 μA for an initial threshold voltage of 2.45 V, before the pre-program is performed. On the contrary, if the threshold voltage is increased up to 3.3 V after the F-N pre-program is performed for 100 μs under the above conditions, the consumed program current is 7.89 μA. This value is just ⅕ of the program current (40.3 μA) consumed by not performing the pre-program.

Figure 10:
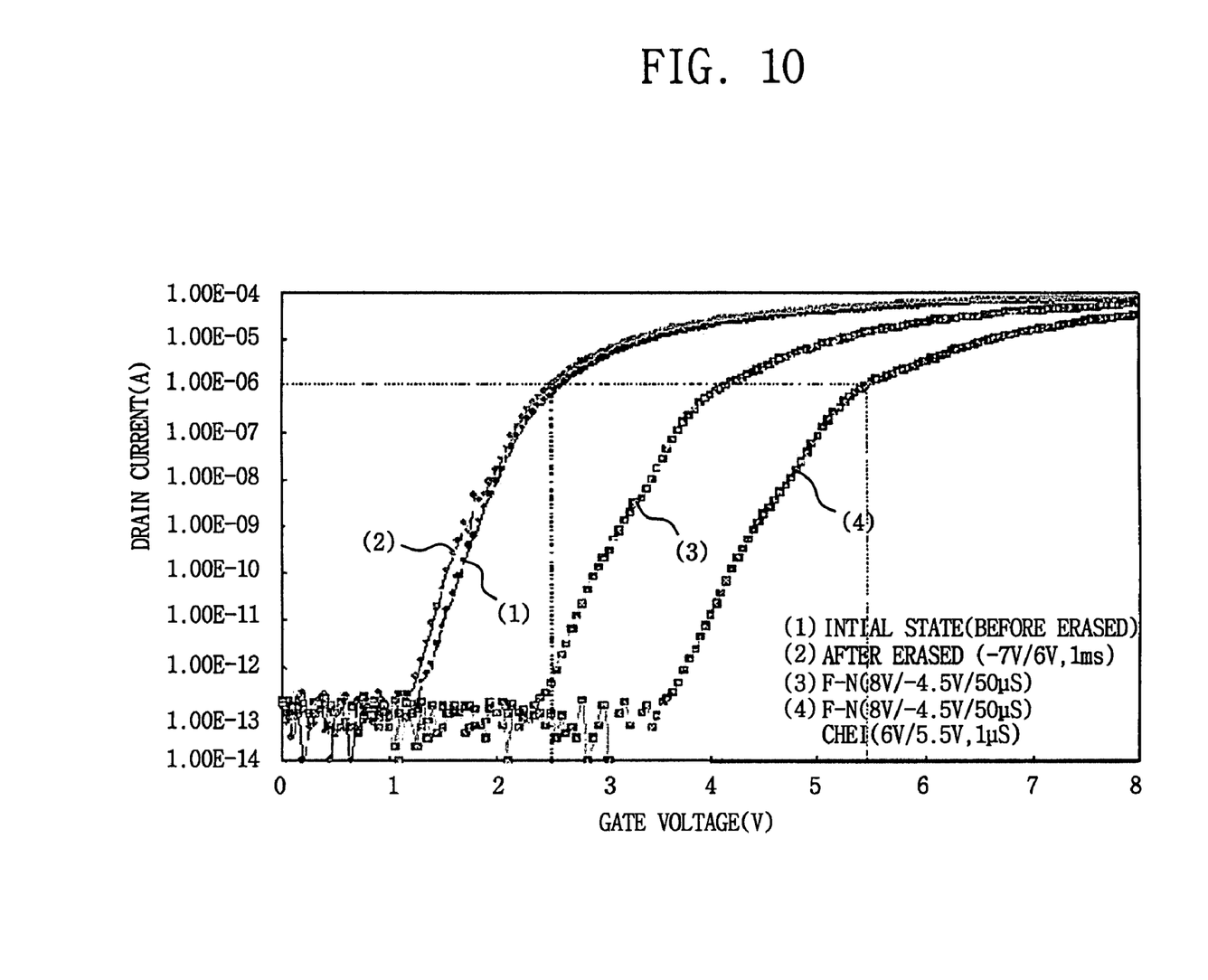
FIG. 10 is a graph depicting the increase in threshold voltage in accordance with F-N pre-program.

FIG. 10 is a graph depicting the increase in threshold voltage in accordance with F-N pre-program. FIG. 10 shows the threshold voltages in the cases of performing F-N pre-program, and performing a main-program after the pre-program, and the cases of before erasing (initial), and after erasing. −7 V and 6 V are applied on the gate and the drain respectively during erasing. The F-N pre-program is performed by applying 8 V and −4.5 V on the gate and the drain, respectively. The main-program is performed by inducing CHEI, and 6 V, 5.5 V, and 1 V are applied on the gate, the drain, and the source, respectively. After the threshold voltage (based on the voltage providing 1 μA of drain current in FIG. 10) is increased above or equal to 4 V by performing the pre-program for 50 μs, the main-program is performed for 50 μs to increase the threshold voltage up to 5.5 V.

The increased amount of threshold voltage varies in accordance with pre-program time, and thus, the decreased amount of program current varies accordingly. Generally, the threshold voltage is increased in proportion to the pre-program time. Thus, with the performance of the pre-program, the program time can be increased.

Figure 11:
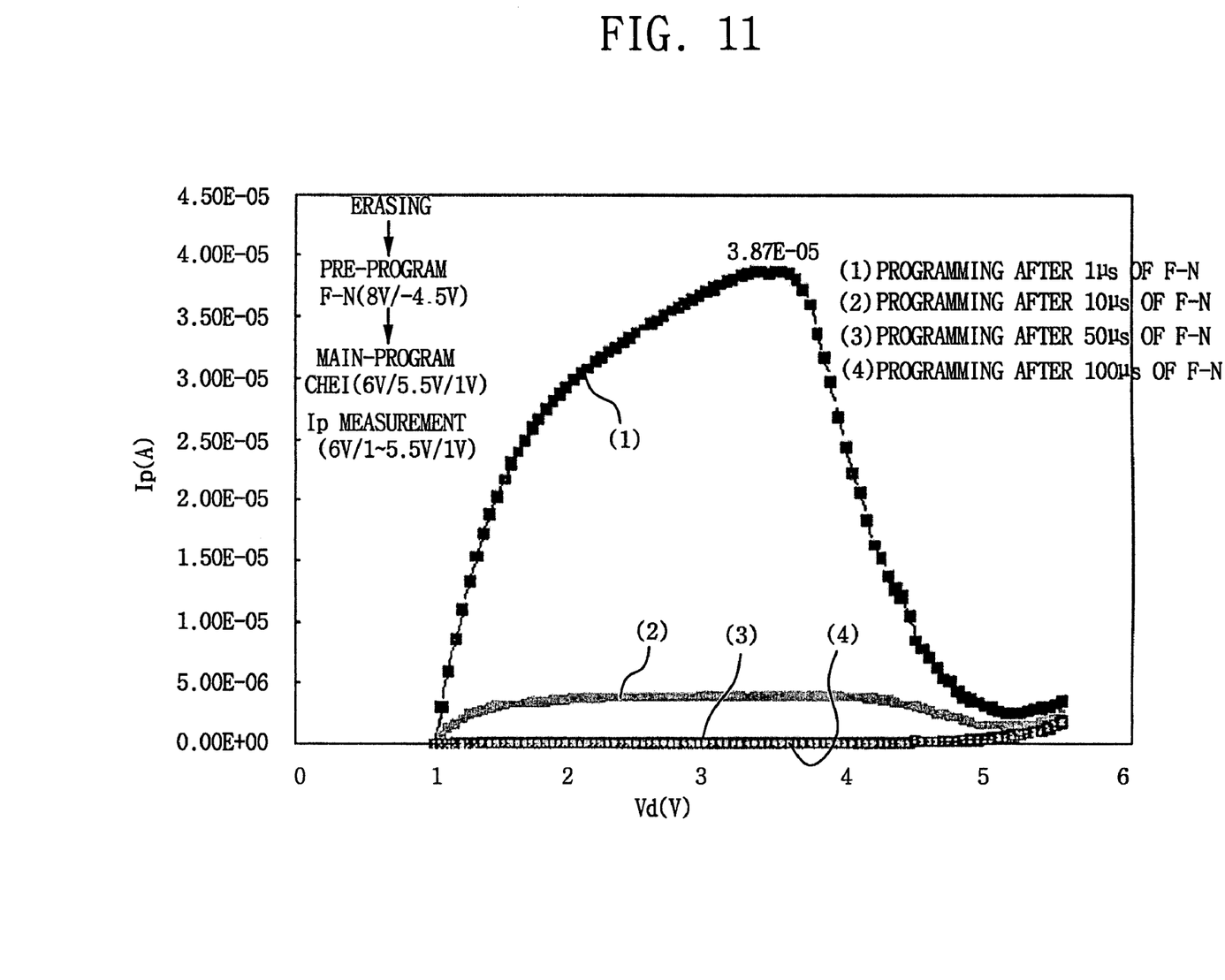
FIG. 11 is a graph depicting the change in program current in accordance with F-N pre-program time.

FIG. 11 is a graph depicting the change in program current in accordance with pre-program time utilizing the F-N tunneling. The program current of FIG. 11 is obtained by performing a pre-program by applying 8 V and −4.5 V on the gate and the drain, respectively, and performing a main-program for 50 μs by applying 6 V, 5.5 V and 1 V on the gate, the drain, and the source, respectively. The times for the pre-program are 1 μs, 10 μs, 50 μs, and 100 μs. The pre-program current of FIG. 11 is obtained by applying 6 V and 1 V on the gate and the source, respectively, with the variation of drain voltages from 1 V to 5.5 V. In the case of performing the pre-program for 1 μs, 38.7 μA of program current is consumed, and in the case of performing for 50 μs, 1.98 μA of program current is consumed, which is reduced down to as much as about 19 times.

By performing additional pre-programming according to the invention, the entire program time is increased up to above two times, but the consumption of program current may be reduced down 5 to 20 times. As a result, with the introduction of the pre-program, the power consumption can be greatly reduced overall.

According to the invention described as above, the power consumption can be reduced during the programming of the non-volatile memory device having a charge storage layer between a semiconductor substrate and a gate. Accordingly, it is expected that the non-volatile memory device can be employed on a merged flash logic requiring 10 μA to 15 μA of program current per cell. Further, since the size of a charge pumping circuit can be reduced for program current supply in the case of a stand-alone device, the increase of cell efficiency is expected according thereto.

What is claimed is:

1. A programming method of a non-volatile memory device having a cell comprising a charge storage layer interposed between a semiconductor substrate and a gate electrode, and a source and a drain in the semiconductor substrate on both sides of the gate electrode, respectively, the programming method comprising:

selecting the cell for programming:

applying a first constant voltage to the gate electrode in the selected cell during an entire pre-program period;

controlling a pre-program time that the first constant voltage is applied to the gate electrode to increase a threshold voltage of the non-volatile memory device during a pre-program period; and immediately following the pre-program period, performing a main-program on the pre-programmed non-volatile memory device by applying a second constant voltage to the gate electrode in the selected cell, wherein the second constant voltage is greater than the first constant voltage.

2. The programming method according to claim 1, wherein the charge storage layer is formed of an electrically-floated conductive layer or a dielectric layer having a trap site.

3. The programming method according to claim 1, wherein the charge storage layer is located relatively close to either the source or the drain.

4. The programming method according to claim 1, wherein a part of the gate electrode overlaps the charge storage layer.

5. The programming method according to claim 1, wherein a voltage applied on the gate electrode in order to perform the pre-program is lower than a voltage applied on the gate electrode in order to perform the main-program.

6. The programming method according to claim 1, wherein a voltage applied on the drain in order to perform the pre-program is lower than a voltage applied on the drain in order to perform the main-program.

7. The programming method according to claim 1, wherein the pre-program is performed by applying a positive voltage on the gate electrode, and generating an electric potential difference between the source and the drain.

8. The programming method according to claim 1, wherein the pre-program is performed by applying a negative voltage on the semiconductor substrate.

9. The programming method according to claim 1, wherein the pre-program is performed by applying a positive voltage on the gate electrode, and applying a negative voltage on the drain or the source.

10. The programming method according to claim 1, further comprising ramping up a voltage applied to the drain from an initial value while controlling the pre-program time.

11. A programming method of a non-volatile memory device having a cell comprising a tunnel dielectric layer, a charge storage layer, a blocking dielectric layer, and a gate electrode, which are stacked on a semiconductor substrate, and a source and a drain in the semiconductor substrate on both sides of the gate electrode, respectively, the programming method comprising:

selecting the cell for programming:

applying a first constant voltage to the gate electrode in the selected cell during an entire pre-program period to increase a threshold voltage during a pre-program of the non-volatile memory device; controlling a time for the pre-program period; and immediately following the pre-program period, performing a main-program on the pre-programmed non-volatile memory device by applying a second constant voltage to the gate electrode in the selected cell, wherein the second constant voltage is greater than the first constant voltage.

12. The programming method according to claim 11, wherein the charge storage layer is formed of an electrically-floated conductive layer or a dielectric layer having a trap site.

13. The programming method according to claim 11, wherein the charge storage layer is located relatively close to either the source or the drain.

14. The programming method according to claim 11, wherein a part of the gate electrode overlaps the charge storage layer.

15. The programming method according to claim 11, wherein the constant voltage applied on the gate electrode in order to perform the pre-program is lower than a voltage applied on the gate electrode in order to perform the main-program.

16. The programming method according to claim 11, wherein a voltage applied on the drain in order to perform the pre-program is lower than a voltage applied on the drain in order to perform the main-program.

17. The programming method according to claim 11, wherein the pre-program is performed by applying a positive voltage on the gate electrode, and generating an electric potential difference between the source and the drain.

18. The programming method according to claim 11, wherein the pre-program is performed by applying a negative voltage on the semiconductor substrate.

19. The programming method according to claim 11, wherein the pre-program is performed by applying a positive voltage on the gate electrode, and applying a negative voltage on the drain or the source.

20. The programming method according to claim 1, wherein the pre-program is performed by simultaneously ramping up a voltage applied to the gate electrode and the drain from an initial value.

21. The programming method according to claim 20, wherein a voltage applied to the source is ramped down from an initial value.

22. The programming method according to claim 1, wherein an increase of the threshold voltage is proportional to the pre-program time.

23. The programming method according to claim 1, wherein the constant voltage is applied to the selected gate electrode during the entire pre-program period.

24. A programming method of a non-volatile memory device having a cell comprising a charge storage layer interposed between a semiconductor substrate and a gate electrode, and a source and a drain in the semiconductor substrate on both sides of the gate electrode, respectively, the programming method comprising:

selecting the cell for programming;

pre-programming the non-volatile memory device by applying a first constant voltage to the gate electrode in the selected cell during an entire pre-program period to increase a threshold voltage of the non-volatile memory device;

controlling a time for the pre-program period; and immediately following the pre-program period, main-programming the pre-programmed non-volatile memory device by applying a second constant voltage to the selected gate electrode, wherein the second constant voltage is greater than the first constant voltage, and wherein voltages applied to the source and the drain are constant during the pre-programming.

* * * * *

UNITED STATES PATENT AND TRADEMARK OFFICE
CERTIFICATE OF CORRECTION

| | | |
|---|---|---|
| PATENT NO. | : 7,170,794 B2 | Page 1 of 1 |
| APPLICATION NO. | : 10/971201 | |
| DATED | : January 30, 2007 | |
| INVENTOR(S) | : Ki-Chul Kim et al. | |

It is certified that error appears in the above-identified patent and that said Letters Patent is hereby corrected as shown below:

Column 10, line 14, the word "programming:" should read -- programming; --;
Column 10, line 67, the word "programming:" should read -- programming; --.

Signed and Sealed this

Seventh Day of October, 2008

JON W. DUDAS
*Director of the United States Patent and Trademark Office*